United States Patent [19]
Wever et al.

[11] Patent Number: 5,805,423
[45] Date of Patent: Sep. 8, 1998

[54] BATTERY CONTACT AND RETENTION APPARATUS FOR PRINTED CIRCUIT BOARDS

[75] Inventors: Jennifer A. Wever, Farmington Hills; Steven R. Settles, Sterling Heights; Thomas P. Benzie, Canton, all of Mich.

[73] Assignee: United Technologies Automotive, Dearborn, Mich.

[21] Appl. No.: 650,014

[22] Filed: May 17, 1996

[51] Int. Cl.⁶ .............................. H05K 1/14; H05K 1/18
[52] U.S. Cl. .................... 361/760; 361/765; 361/768; 361/769; 361/807; 361/809; 439/627; 439/500; 429/98; 429/100; 429/163
[58] Field of Search ..................... 361/760, 763, 361/765, 807, 809, 811, 767, 768, 769; 439/627, 500; 429/98, 100, 163

[56] References Cited

U.S. PATENT DOCUMENTS

| | | | |
|---|---|---|---|
| 4,487,820 | 12/1984 | Engelstein et al. | 429/100 |
| 4,868,074 | 9/1989 | Omori et al. | 429/98 |
| 5,186,639 | 2/1993 | Comerci et al. | 439/188 |
| 5,188,912 | 2/1993 | Katoh et al. | 429/96 |
| 5,240,792 | 8/1993 | Kawabata et al. | 429/197 |

*Primary Examiner*—Leo P. Picard
*Assistant Examiner*—David Foster
*Attorney, Agent, or Firm*—Niro, Scavone, Haller & Niro

[57] ABSTRACT

The present invention relates generally to an apparatus for securely retaining a small battery or electric cell on a printed circuit board, and for providing electrical contacts which engage the battery for use in an electronic circuit. The present invention provides an improved mechanical attachment of the battery retention apparatus to the circuit board by means of a plurality of tabs which extend through and engage the printed circuit board. These tabs are separate and apart from the electrical connections to the circuit board.

The apparatus of the present invention provides a lightweight, low-profile, rugged battery retention mechanism capable of withstanding impulse forces. The apparatus is low-cost, easily manufactured, and facilitates easy installation, and is particularly well suited for remote control devices and other hand-held or portable units.

19 Claims, 1 Drawing Sheet

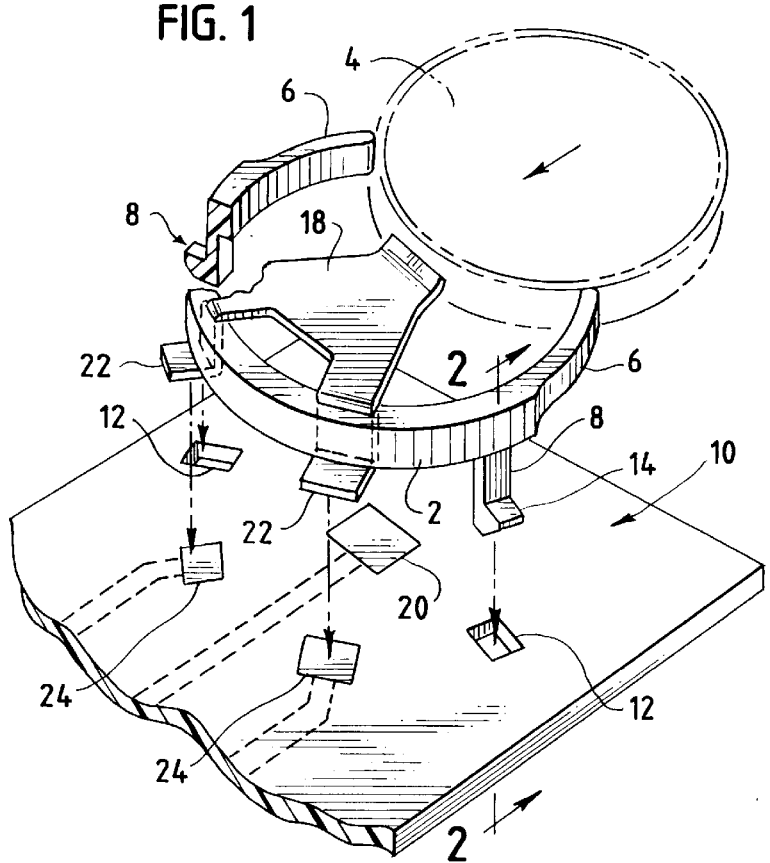
FIG. 1
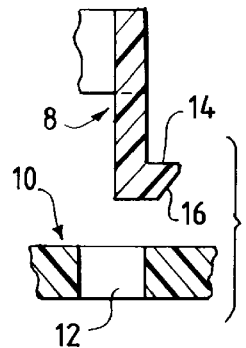
FIG. 2
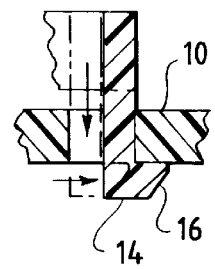
FIG. 3
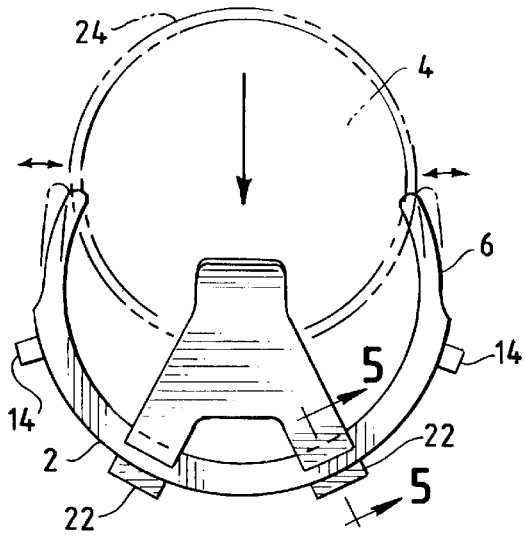
FIG. 4
FIG. 5
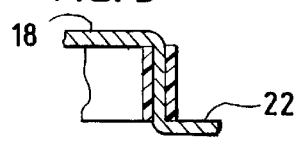
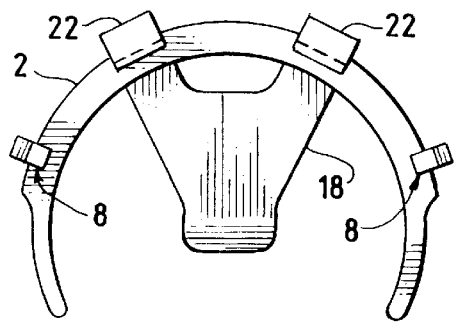
FIG. 6
FIG. 7

BATTERY CONTACT AND RETENTION APPARATUS FOR PRINTED CIRCUIT BOARDS

BACKGROUND OF THE INVENTION

The present invention relates generally to an apparatus for securely retaining a small battery or electric cell on a printed circuit board, and for providing electrical contacts which engage the battery for use in an electronic circuit. The present invention provides an improved mechanical attachment of the battery retention apparatus to the circuit board which is separate and apart from the electrical connections to the circuit board.

There are certain applications where durable and rugged battery holders are desired. Small circuit boards with batteries are oftentimes required to operate under harsh conditions, such as in remote control devices that may be dropped or otherwise mishandled. Such devices are subjected to severe mechanical impulse forces which impose stresses on the battery retention apparatus and associated electrical contacts. The prior art devices have been found to be either ineffective at withstanding such mistreatment, or, even if acceptably effective, are inefficient from a manufacturing standpoint (they are too bulky and heavy, or require additional manufacturing steps such as drilling and mounting—which in turn requires additional hardware such as rivets or screws).

Our invention is directed towards solving the problem of providing a lightweight, yet strong and durable battery retention frame which can be efficiently manufactured. The frame also provides desirable electrical connection properties, and is configured to facilitate simplified mounting of the frame on printed circuit boards.

The invention is particularly well suited to small hand-held electronic devices such as remote control devices, but is not so limited in its application.

DESCRIPTION OF THE PRIOR ART

Many prior art devices use "brute force" techniques to ensure that batteries are held in their proper position. Large retention frames are sometimes used, and are fastened to printed circuit boards with an adhesive for example. Sometimes screws or rivets are used to ensure that the battery holder does not become dislocated during mishandling. These techniques have the disadvantage of requiring additional fastening devices such as rivets or screws, or added manufacturing steps such as applying an adhesive. These added materials and the associated addition of manufacturing steps increase the overall cost of the final product. The riveting or screwing steps, whether done manually or by machine, can greatly increase the materials cost and decrease the throughput of an assembly line operation. The added materials also increase the overall weight of the device, which is a further disadvantage, particularly in small hand-held or other portable devices.

Some prior art battery retention devices use metal posts to provide both the mechanical attachment of the battery holder to the printed circuit board and the electrical contacts between the battery holder and the board. The metal posts are generally integral to the battery retention frame and extend through pre-drilled holes in the printed circuit board. The posts are then soldered to the circuit board.

This type of through-hole connection requires additional assembly steps, and correspondingly increases the cost of production. For example, the post-receiving holes must be pre-drilled at a station, and plated with a metallic material appropriate for a solder connection. The present invention does not have the disadvantage of the through-hole prior art devices because the tab-receiving holes have lower mechanical tolerances, and can be provided by a simple punching step, as opposed to a more costly drilling step. Further, the resulting holes need not be plated because they only provide mechanical, not electrical, connection.

An associated disadvantage of the through-hole prior art devices is that they combine the mechanical attachment mechanism with the electrical connection to the circuit board. That is, the metal posts serve to anchor the retention ring to the circuit board as well as provide the electrical connection. In remote control devices and other hand-held devices which are susceptible to rough treatment (e.g., being accidentally dropped onto concrete or hard surfaces), combined electrical and mechanical attachments have proven to be a significant drawback. Over time, the impulse forces from accidental dropping of the device cause the metal posts to loosen. The loosening of the posts allows increased movement and vibration, thereby making damage from subsequent impulse forces more likely. Eventually, the movement causes the electrical connection between the metal posts and associated metal soldering pads to fail, resulting in an intermittent electrical contact (or an open circuit) and failure of the device.

In the present invention, the locking tab mechanisms of the frame are designed to increase the strength and durability of the frame in a manner which is separate and apart from the electrical connection. In so doing, the impulse forces imparted to the structure by dropping the device are absorbed mainly by the locking tabs and a semi-circular or penannular retention ring, thereby relieving the stresses that would otherwise be placed on the electrical solder connections.

Other prior art battery retention devices have utilized portions of the printed circuit board housing to retain the battery. While providing a relatively strong retention mechanism, the disadvantages associated with this technique arise in the manufacturing process. The metallic contacts for the electrical connections must be press-fit into the housing. This requires an additional step in the manufacturing process to be performed on a separate part—the housing—as opposed to mounting the contacts to the printed circuit board. The electrical connections from the press-fit contacts to the printed circuit board are provided either by means of a spring-type contact with pads on the board, or by soldering wires between the contacts and the board. Again, a costly multi-step process is required, and the resulting apparatus has additional failure points such as the wires or spring contacts.

The present invention, on the other hand, facilitates easy assembly. The battery retention frame is placed onto the board and automatically snaps into place. The electrical connection is subsequently established using a surface-mount soldering technique. The surface-mount soldering technique is preferred because, among other reasons, no drilling and plating steps are required in the printed circuit board manufacture. The locking tabs conveniently hold the frame in position until the soldering step is performed.

SUMMARY OF THE INVENTION

The battery retention apparatus of the present invention comprises a penannular ring with a plurality of semi-rigid locking tabs extending axially from the ring. The locking tabs are generally "L" shaped, and flex (together with flexing of the penannular ring) as they are pressed through receiving holes on the printed circuit board. As the bottoms of the "L" shaped locking tabs protrude from the other side of the circuit board, the tabs snap back into a straightened position so that the bottoms of the "L" locking tabs engage the other side of printed circuit board, thereby securing the retention ring in place. The separate electrical contacts are then surface-mount soldered to the printed circuit board.

The apparatus of the present invention thus provides a lightweight, low-profile, rugged battery retention mechanism capable of withstanding impulse forces from mishandling or other sources. The apparatus is low-cost, easily manufactured, and facilitates easy installation. The apparatus is particularly well suited for remote control devices and other hand-held units.

BRIEF DESCRIPTION OF THE DRAWINGS

FIG. 1 is an exploded perspective view of the battery retention device and printed circuit board;

FIG. 2 is a sectional view of a locking tab above the printed circuit board;

FIG. 3 is a sectional view of a locking tab engaging the printed circuit board;

FIG. 4 is a top plan view showing the battery being positioned within the retention ring;

FIG. 5 is a sectional view of the contact passing through the center of the retention ring;

FIG. 6 shows the bottom plan view of the retention ring;

FIG. 7 shows an alternative contact configuration on the printed circuit board.

DETAILED DESCRIPTION OF THE PREFERRED EMBODIMENTS

The preferred embodiment of the invention is shown in FIG. 1. The retention device comprises a generally semi-circular penannular ring (2) designed for circular batteries (4). Alternatively the ring can be a multifaceted polygonal penannular shape (e.g., the penannular ring could be a truncated portion of a hexagonal annular ring). The inside radius of the semi-circular ring is substantially the same as the outermost radius of the battery or cell (in this specification, the terms battery and cell are used interchangeably to refer to what are commonly known as "watch or calculator batteries").

In the preferred embodiment, the circumferential arc of the semi-circular ring (2) is greater than half the circumference of a corresponding non-truncated, or fully annular, ring. This configuration assists in retaining the battery (4) in position. The battery is intended to slide into the semi-circular retention ring through the gap between the ends of the semicircular ring (2) as shown in FIG. 4. Because the gap is smaller than the diameter of the battery, the ends (6) of the ring (2) must flex to allow the battery to slide into position. For this reason, the radial thickness of the ends (6) is reduced somewhat to permit the ends of the ring to flex more easily as shown in FIG. 4.

Extending axially from the semicircular ring (2) are a plurality of "L" shaped locking tabs (8). The locking tabs extend down through the printed circuit board (10) to secure the retention ring to the board. The ends of the locking tabs extend radially outward to form feet (14). The holes or tab receiving portions (12) of the printed circuit board (10) must be large enough to allow the feet (14) of the "L" shaped tabs (8) to fit through them, but are aligned with some radial offset as shown in FIG. 2 so that the feet (14) are biased outwardly when inserted to properly and firmly engage the circuit board as shown in FIG. 3.

To insert the feet (14), the ring must be flexed slightly in the radial direction. In this manner, the feet (14) of the tabs (8) are aligned with the receiving portions (12). Additionally, the outer faces (16) of the feet (14) are slanted or beveled so as to guide the feet into the receiving portions (12). When the feet are fully inserted through the receiving portions (12), the retention ring un-flexes, thereby assuming its normal semicircular shape, and the feet (14) extend radially outward to engage the printed circuit board (10) as shown in FIG. 3. Alternatively, the feet may extend radially inward, with the receiving portions (12) properly aligned for such a configuration.

The electrical contacts are provided by contacts (18) and (20) as shown in FIG. 1. Contact (20) is a metallic pad on the printed circuit board. A preferable alternative, however, is to attach a small metallic contact (21) to pad (20) using surface mount technology as shown in FIG. 7. The advantages obtained from using a surface mount contact include providing better metallic compatibility with the battery electrode, and providing a slight height differential between the printed circuit board and the contact (21) to permit a better electrical connection. This height differential is shown in FIG. 7 as the parameter T.

Contact (18) has two connection tabs (22) which are surface-mount soldered to two metallic pads (24) on the printed circuit board (surface mount technology is well known to those of ordinary skill in the art as a technique of providing electrical connections between a printed circuit board and electrical components without the need for the terminals of the components to go through the printed circuit board). The two tabs (22) go through the retention ring as shown in FIG. 5.

It should be noted that the retention ring is preferably made of a plastic insulating material which serves to electrically isolate the tabs (22) and contact (18) from the side of the battery which is in contact with the retention ring. In FIG. 5 (as well as FIGS. 4 and 6), it can be seen that the tabs (22) go through the center of the retention ring material, and do not directly contact a properly positioned battery. The advantage to this insulating effect is to prevent the battery from being short circuited if placed upside down within the retention device.

The printed circuit board is intended for use within remote controllers or other portable devices. Thus, the circuit board is typically contained within a suitable housing. In the preferred embodiment, the housing is used to complement the battery retention device. For example, in the final assembly, the housing, or elements thereof, are positioned adjacent to the battery and engage the top and/or side of the battery. Alternatively, the housing may provide a battery compartment access cover to facilitate battery replacement. An alternate preferred embodiment utilizes a tab which is integral to the access cover which engages the top and/or side of the battery to further secure the battery in the final assembly.

It is to be understood that the above description is intended to be illustrative and not restrictive. Many embodiments including various changes and modifications to the preferred embodiments of this invention will be apparent to those of skill in the art upon reviewing the above description. Such changes and modifications can be made without departing from the spirit and scope of the present invention. The scope of the inventions should therefore be determined not by reference to the above description, but should instead be determined with reference to the appended claims, along with the full scope of equivalents to which such claims are entitled.

We claim:

1. An apparatus for retaining a battery on a circuit board comprising:

(a) a penannular retention member;

(b) a plurality of support tabs extending from said retention member;

(c) a plurality of locking tabs, each one of said locking tabs associated with a single one of said support tabs, wherein said locking tabs extend radially from said support tabs;

(d) an electrical conductor with at least first and second contacts, said first contact adapted for connection to a battery, and said second contact adapted for connection to an electrical circuit.

2. The apparatus for retaining a battery on a circuit board of claim 1, wherein said penannular retention member is a segment of an arcuate semi-circular ring.

3. The apparatus for retaining a battery on a circuit board of claim 1, wherein the ends of said penannular retention member are separated by a distance less than the diameter of said penannular retention member.

4. The apparatus for retaining a battery on a circuit board of claim 3, wherein said penannular retention member is non-rigid.

5. The apparatus for retaining a battery on a circuit board of claim 3, wherein the ends of said penannular retention member are tapered.

6. The apparatus for retaining a battery on a circuit board of claim 1, wherein said support tabs extend substantially axially downward from said retention member.

7. The apparatus for retaining a battery on a circuit board of claim 1, wherein said locking tabs extend radially outward from said support tabs.

8. The apparatus for retaining a battery on a circuit board of claim 1, wherein said locking tabs extend radially inward from said support tabs.

9. The apparatus for retaining a battery on a circuit board of claim 1, wherein said electrical conductor is electrically insulated from the interior surface of said truncated annular retention member.

10. A battery retention apparatus comprising:

(a) a penannular retention member;

(b) at least one support tab extending substantially axially from the bottom of said retention member;

(c) at least one locking tab associated with said at least one support tab, wherein said at least one locking tab extends radially from said at least one support tab;

(d) an electrical conductor with at least first and second conductor contacts, said first conductor contact adapted for connection to a battery, and said second conductor contact for connection to an electrical circuit;

(e) a printed circuit board having at least a first and second electrical circuit contacts, wherein said first circuit contact is adapted for connection to a battery and said second circuit contact is electrically connected to said second conductor contact, and said printed circuit board further having support tab receiving portions which engage said at least one locking tab.

11. The battery retention apparatus of claim 10, wherein said first circuit contact comprises a surface mounted electrical conductor.

12. The battery retention apparatus of claim 10, wherein said penannular retention member is a segment of an arcuate semi-circular ring.

13. The battery retention apparatus of claim 10, wherein the ends of said penannular retention member are separated by a distance less than the diameter of said penannular retention member.

14. The battery retention apparatus of claim 13, wherein the ends of said penannular retention member are tapered.

15. The battery retention apparatus of claim 10, wherein said penannular retention member is non-rigid.

16. The battery retention apparatus of claim 10, wherein said support tabs extend substantially axially downward from said retention member.

17. The battery retention apparatus of claim 10, wherein said locking tabs extend radially outward from said support tabs.

18. The battery retention apparatus of claim 10, wherein said locking tabs extend radially inward from said support tabs.

19. The battery retention apparatus of claim 10, wherein said electrical conductor is electrically insulated from the interior surface of said truncated annular retention member.

* * * * *